(12) United States Patent
Hahm et al.

(10) Patent No.: US 7,422,802 B2
(45) Date of Patent: Sep. 9, 2008

(54) LUMINESCENT MATERIAL AND ORGANIC ELECTROLUMINESCENT DEVICE USING THE SAME

(75) Inventors: Yun Hye Hahm, Seoul (KR); Yeon Hwan Kim, Gyeonggi-do (KR); Sung Kil Hong, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 177 days.

(21) Appl. No.: 11/206,762

(22) Filed: Aug. 19, 2005

(65) Prior Publication Data
US 2006/0082291 A1  Apr. 20, 2006

(30) Foreign Application Priority Data
Aug. 23, 2004  (KR) .................. 10-2004-0066445

(51) Int. Cl.
*H01L 51/54* (2006.01)
(52) U.S. Cl. .................. 428/690; 428/917; 313/504; 313/506
(58) Field of Classification Search .......... 428/690, 428/917; 313/504, 506; 252/301.16; 548/440
See application file for complete search history.

(56) References Cited

U.S. PATENT DOCUMENTS 6,242,115 B1 * 6/2001 Thomson et al. ............ 428/690
2006/0134460 A1 * 6/2006 Kondakova et al. ......... 428/690

FOREIGN PATENT DOCUMENTS

| JP | 2002-100476 | 4/2002 |
| JP | 2003-317966 | 11/2003 |
| WO | WO 99/13691 | 3/1999 |

OTHER PUBLICATIONS

Piet, J., et al., *Rapid rotation of energy in the excited state of a circular hexa-carbazole array*, Chemical Physics Letters, 1998. pp. 13-18.
Henrie, II, R., et al., *Reaction of Diazole Anions with Hexafluorobenzene: An Unexpectedly Facile Entry Into Hexa(diazol-1-yl)-Benzenes*[1] Heterocycles, 1993. pp. 415-426.

* cited by examiner

*Primary Examiner*—Dawn Garrett
(74) *Attorney, Agent, or Firm*—McKenna Long & Aldridge LLP

(57) ABSTRACT

Disclosed herein are a luminescent material represented by Chemical Formula 1 and an organic electroluminescent device using the same.

6 Claims, 2 Drawing Sheets

[Figure 1]
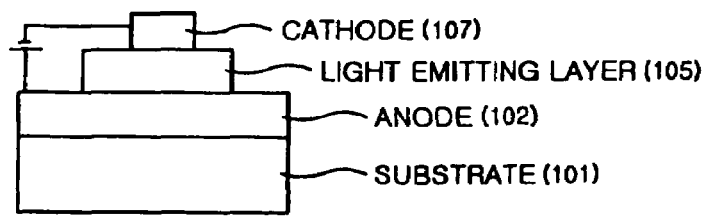
[Figure 2]
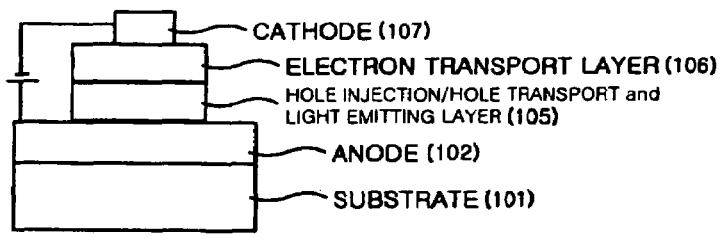
[Figure 3]
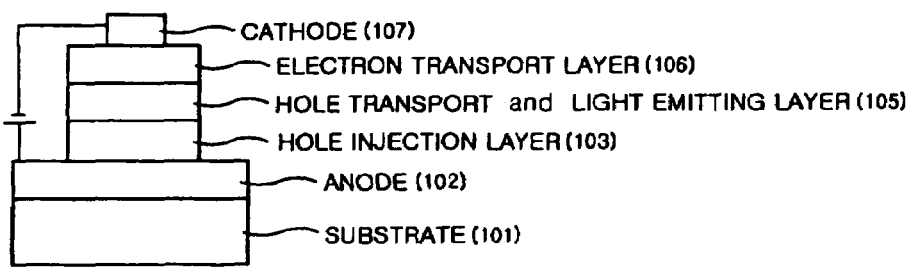

[Figure 4]
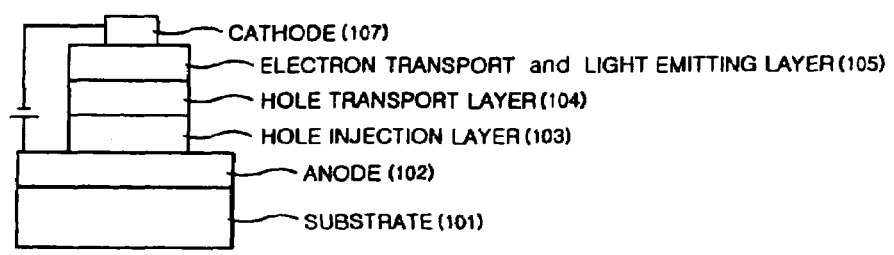

LUMINESCENT MATERIAL AND ORGANIC ELECTROLUMINESCENT DEVICE USING THE SAME

TECHNICAL FIELD

The present invention relates to a novel luminescent material and an organic electroluminescent device using the same.

BACKGROUND ART

Now that society is well into the information-intensive age in the 21st century, high-performance flat displays for multimedia are becoming of greater interest to facilitate the easy and quick acquisition of extensive information. Now, liquid crystal displays enjoy great predominance over other flat displays, but much effort is now actively being made all over the world to develop new and more economical flat displays with higher performance distinguished from liquid crystal displays. Organic electroluminescent devices, which have lately attracted considerable attention, have advantages of low operation voltage, rapid response speed, high efficiency, and wide viewing angle over liquid crystal displays. In addition, organic electroluminescent displays can readily accommodate the recent trend towards slimness and light weight because the thickness of the modules can be less than 2 mm in total and the plastic substrates as thin as 0.3 mm or less can be used in manufacturing organic electroluminescent displays. Furthermore, the manufacturing cost for organic electroluminescent displays is lower than that for liquid crystal displays.

An organic electroluminescent device typically has a structure of an anode and a cathode with an organic material layer disposed therebetween. On the principle of electroluminescence, such an organic electroluminescent device works by injecting electrons from the cathode and holes from the anode into the organic material layer, combining the electrons and the holes to generate excitons, and transitioning the excitons from excited state to ground state to generate light having certain wavelengths. Now, active research is being made into organic electroluminescent devices in which organic material layers sandwiched between two electrodes have a functionally separated, laminated structure.

For organic luminescent materials in which excitons are generated through combining of holes and electrons and emit light therefrom, single materials may be used in an organic electroluminescent device. Alternatively, the organic luminescent materials may consist of a host material and a guest material which are functionally different. Here, the host material functions to generate excitons with received holes and electrons and then to transfer the energy of excitons to the guest material, and the guest material functions to emit light by way of forming excitons with the transferred energy.

Host materials or guest materials alone can emit light in organic electroluminescent devices. However, when used alone, luminous efficiency and brightness are low, and intermolecular self-packing sometimes causes not only to change its intrinsic property, but also its excimer's emission, such as inclination from a pure intrinsic light color toward white color. These problems can be avoided by using a host material doped with a small amount of a guest material.

In a luminescent material, the excitons, that are generated when electrons and holes are coupled with each other, are divided into fluorescent excitons that emit light through singlet-singlet transition and phosphorescent exitons that emit light through triplet-singlet transition. Here, a material from which light is generated via fluorescent excitons is called a fluorescent material and a material from which light is generated via phosphorescent excitons is called a phosphorescent material.

It is well known that Fluorescent excitons and phosphorescent excitons are formed at a probability ratio of 1:3 in a luminescent material. Thus, an organic electroluminescent device employing a phosphorescent material as a luminescent material is preferable in terms of luminous efficiency. In addition, when a host material is doped with a guest material, a guest material is preferably a phosphorescent material in terms of luminous efficiency. In this case, because the energy of a host material is not transferred only through light to a guest material, the host material may be a fluorescent material. However, the energy band gap of a host material that is used in combination with a phosphorescent guest material must be far larger than that of a host material that is used in combination with a fluorescent guest material. The reason is as follows.

The energy of triplet excitons is usually known to be lower than that of singlet excitons. Thus, when the energy of excitons generated in a host material is transferred into a guest material, the triplet excitons of the host material must have larger energy than do the singlet excitons of the guest material. By the way, a phosphorescent guest material, especially a blue light-emitting phosphorescent guest material, has a far larger energy gap than a fluorescent guest material. Accordingly, in order to transfer the energy of triplet excitons generated in a host material to a phosphorescent guest material, the energy band gap of the host material must be far larger than that of a host material that is used in combination with a fluorescent guest material.

DISCLOSURE

Technical Problem

Thus far, however, there are not many materials that have such large band gaps as to be usable in combination with phosphorescent guest materials.

Recently, extensive attention has been paid to carbazole derivatives as host materials usable in combination with phosphorescent guest materials. Of the carbazole derivatives, CBP (4,4'-N,N'-dicarbazole-biphenyl) is well known to be usable in combination with phosphorescent guest materials. However, having the problems of low luminous efficiency with respect to each of the three primary colors and showing poor durability due to its low glass transition temperature, CBP cannot provide satisfactory brightness and lifetime for organic electroluminescent devices and thus has not yet been put to practical use.

Technical Solution

The inventors found compounds among carbazole derivatives which can be used as a luminescent material in organic luminescent device. In particular, they showed that the compounds can be used as a fluorescent guest material, as well as a host material in combination with a phosphorescent guest material.

Therefore, it is an object of the present invention to provide a novel luminescent material and an organic electroluminescent device using the novel luminescent material.

Advantageous Effects

The compound of the present invention can be used as a luminescent material in an organic electroluminescent device. Particularly, with the ability to be used in combination with a phosphorescent guest material as well as with a fluorescent guest material, the compound can greatly improve brightness and luminous efficiency in organic electroluminescent devices.

DESCRIPTION OF DRAWINGS

FIGS. 1 to 4 are schematic views illustrating structures applicable to the organic electroluminescent device of the present invention.

MODE FOR INVENTION

In one aspect of the present invention, it provides a luminescent material, which is represented by the following Chemical Formula 1:

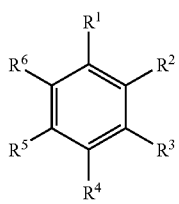

[Chemical Formula 1]

wherein, $R^1$ to $R^6$ each independently are a group represented by the following Chemical Formula 2:

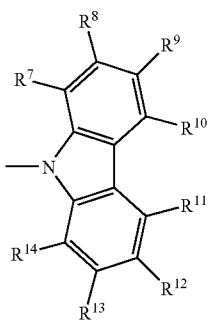

[Chemical Formula 2]

wherein $R^7$ to $R^{14}$ each independently are selected from the group consisting of hydrogen, an aliphatic hydrocarbon containing 1 to 50 carbon atoms, an aromatic hydrocarbon containing 6 to 12 carbon atoms, and a substituted or non-substituted carbazolyl group.

In another aspect of the present invention, it provides an organic electroluminescent device, comprising a first electrode, at least one organic material layer, and a second electrode, in a layered form wherein at least one layer of the organic material layer includes the compound of Chemical Formula 1.

In the organic electroluminescent device, the organic material layer containing the compound of Chemical Formula 1 may additionally contain a fluorescent guest material, a phosphorescent guest material, or other host materials.

Below, a detailed description will be given of the present invention. The present invention provides a luminescent material represented by the following Chemical Formula 1:

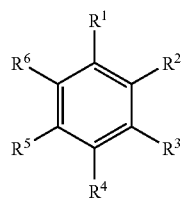

[Chemical Formula 1]

wherein $R^1$ to $R^6$ each independently are a group represented by the following Chemical Formula 2:

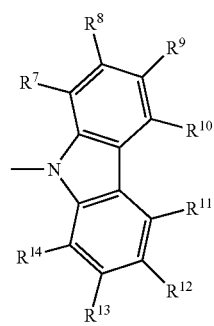

[Chemical Formula 2]

wherein, $R^7$ to $R^{14}$ each are independently selected from the group consisting of hydrogen, an aliphatic hydrocarbon containing 1 to 50 carbon atoms, an aromatic hydrocarbon containing 6 to 12 carbon atoms, and a substituted or non-substituted carbazolyl group.

The structural feature of the compound of Chemical Formula 1 will be explained below. The compound of Chemical Formula 1 features the three-dimensional structure in which six carbazolyl groups are linked to one benzene. The compound has a propeller-like structure due to the individual carbazolyl group forming an angle of near 80 degrees with respect to the plane of the benzene ring due to steric hindrance therebetween [J. J. Piet, H. A. M. Biemans, J. M. Warman, E. W. Meijer, Chemical Physics Letters, 5, 13, 1998]. Although many carbazolyl groups are introduced into one molecule, the carbazolyl group in a compound of Chemical Formula 1 maintains its intrinsic properties because the three-dimensional structure interrupts the pi bond between the carbazolyl groups. A carbazolyl group is known to have a large energy band gap (the energy gap between the highest occupied molecular orbital (HOMO) and the lowest unoccupied molecular orbital (LUMO)) and thus, the compound of Chemical Formula 1 also has a large energy band gap.

Having these characteristics, the compound of Chemical Formula 1 can function as a luminescent material emitting, for example, deep blue light in an organic electroluminescent device.

In addition, due to the large energy band gap attributed to its structure, the compound of Chemical Formula 1 can act as a host material that can be used in combination with a phosphorescent guest material as well as with a fluorescent guest material in an organic electroluminescent device.

In the compound of Chemical Formula 1, as described above, a plurality of carbazolyl groups are introduced, with their intrinsic properties maintained therein, resulting in an increased molecular weight. Generally, the more the molecular weight, the higher the melting point and glass transition temperature. Accordingly, the compound of Chemical Formula 1 undergoes relatively little thermal distortion attributable to the heat generated from an organic electroluminescent device, thereby allowing the device to keep its own initial properties for a long period of time. Particularly, because the compound of Chemical Formula 1 shows a glass transition temperature considerably higher than that of CBP which has been known as a host material usable in combination with a phosphorescent guest material, the compound of Chemical Formula 1 can improve the durability of organic electroluminescent devices when applied thereto.

Furthermore, the compound according to the present invention also can be used as a guest material with a proper host material.

Because the above-mentioned properties result from the unique three-dimensional structure in which six carbazolyl groups are linked to one benzene ring, the above-mentioned properties of the compound of Chemical Formula 1 are not changed even if $R^7$ to $R^{14}$ is substituted with any group among the groups which are defined above. That is, when bulky structures such as carbazolyl groups are concurrently connected to a six positions of the benzene ring, their spatial interaction determines the properties of the resulting compound. Accordingly, the properties of the compound of Chemical Formula 1 are based on the spatial interaction between the carbazole substituents linked to the benzene ring. Any group, even if present, instead of hydrogen, in the carbazolyle group of Chemical Formula 2 linked as a substitutent to the benzene ring of Chemical Formula 1, does not influence the spatial conformation of the core consisting of one benzene ring and six carbazolyl groups. Thus, the conformational structure of the compound of Chemical Formula 1 is not affected by any substituent positioned at any of $R^7$ to $R^{14}$, and also the intrinsic physical properties of the compound of Chemical Formula 1 is not changed. Only, minor properties, such as glass transition temperature, amorphousness, etc., of the compound of Chemical Formula 1 can be changed by changing the substituents at positions of $R^7$ to $R^{14}$.

Examples of the aliphatic hydrocarbon containing 1 to 50 carbon atoms, useful as a substitutent for $R^7$ to $R^{14}$ in the Chemical Formula 2, include methyl, ethyl, propyl, isopropyl, butyl, isobutyl, pentyl, etc., but are not limited thereto.

As a substitutent for $R^7$ to $R^{14}$ in the Chemical Formula 2, the aromatic hydrocarbon containing 6 to 12 carbon atoms may be exemplified by benzene, naphthalene, biphenyl, etc.

The substituted or non-substituted carbazolyl group that can be positioned at $R^7$ to $R^{14}$ in the Chemical Formula 2 may be the same as the carbazolyl group in Chemical Formula 1.

The preparation of the compound of Chemical Formula 1 is disclosed in Robert N. Henrie II, Walter H. Yeager, Heterocycles 35 (1993) 415~426. For example, the compound of Chemical Formula 1 can be prepared as follows. To a suspension of one equivalent of NaH in dimethylform amide is slowly added a solution of one equivalent of a carbazole derivative in dimethylform amide and the reaction mixture is heated to form sodium salts. Subsequently, the reaction mixture is cooled, and 0.15 equivalents of hexafluorobenzene ($C_6F_6$) are slowly added to the reaction mixture, followed by stirring and/or heating for 12 hours or more. Then it is cooled, and cold water is added to solidify the mixture. Filtered white solid is washed with a sufficient amount of ethanol and dried to produce the compound of Chemical Formula 1. The yield is 60% or more based on the amount of hexafluorobenzene.

In the present invention, an example of the compound of Chemical Formula 1 may be represented by the following Chemical Formula 3:

[Chemical Formula 3]

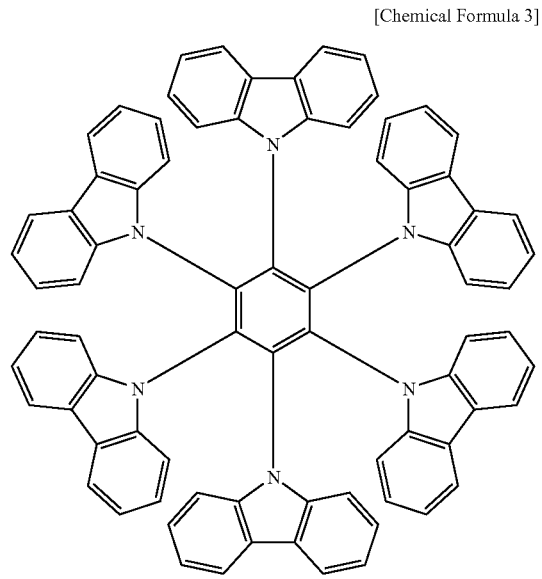

The compound of Chemical Formula 3 is disclosed in Jacob J. Piet, Hendrikus A. M. Biemans, John M. Warman, E. W. Meijer Chemical Physics Letters 289 (1998) 13-18. NMR results of the compound of Chemical Formula 3 are as follows.

R1=H: Analysis Result: m.p.: >550° C., $^1$H NMR (in DMSO, 100° C., 400 MHz): 7.74 (d, 6H, J=8.4 Hz) 7.29 (d, 6H, J=7.6 Hz) 6.68 (t, 6H, J=7.2 Hz) 6.58 (t, 6H, J=7.6 Hz), MS [M+H] 1068

The present invention provides an organic electroluminescent device using the compound of Chemical Formula 1. Detailed explanation is as follows.

The present invention provides an organic electroluminescent device, comprising a first electrode, at least one organic material layer, and a second electrode, in a layered form wherein at least one layer of the organic material layer contains the compound of Chemical Formula 1.

In the organic electroluminescent device of the present invention, the compound of Chemical Formula 1 may be used alone as a luminescent material. Alternatively, the compound of Chemical Formula 1 may act as a host material in combination with a fluorescent guest material or a phosphorescent guest material. Particularly when used in combination with a phosphorescent guest material, the compound of Chemical Formula 1 can greatly improve the efficiency of the device. In addition, the compound of Chemical Formula 1 may be used as a guest material with a proper host material.

Examples of the fluorescent guest material usable in combination with the compound of Chemical Formula 1 include the compounds represented by the following formulas, but are not limited thereto.

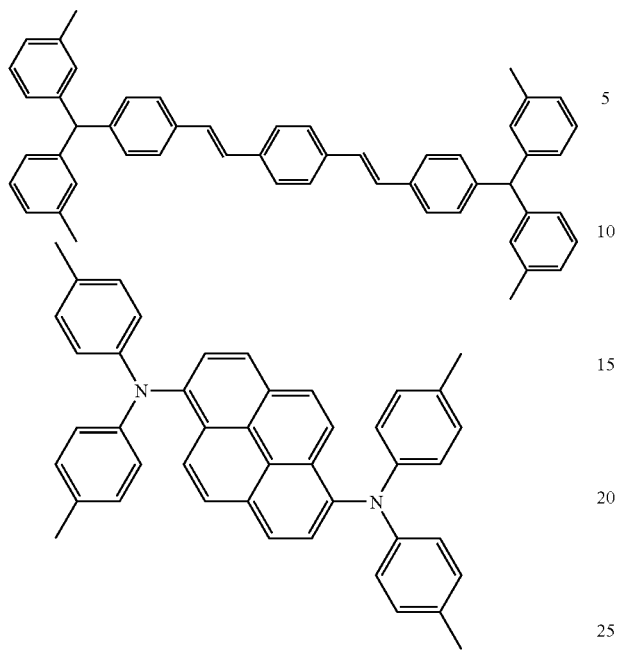

Examples of the phosphorescent guest material usable in combination with the compound of Chemical Formula 1 include Firpic{Iridium(III) bis[(4,6-di-fluorophenyl)-pyridinato-N,C²¹]picolinato}, (CF₃ppy)₂Ir(pic) {Bis2-[3,5-bis(trifluoromethyl)-phenyl]-pyridinato-N,C²¹}, Ir(ppy)₃ (Iridium (III) picolinate) of the following chemical formulas, but are not limited thereto.

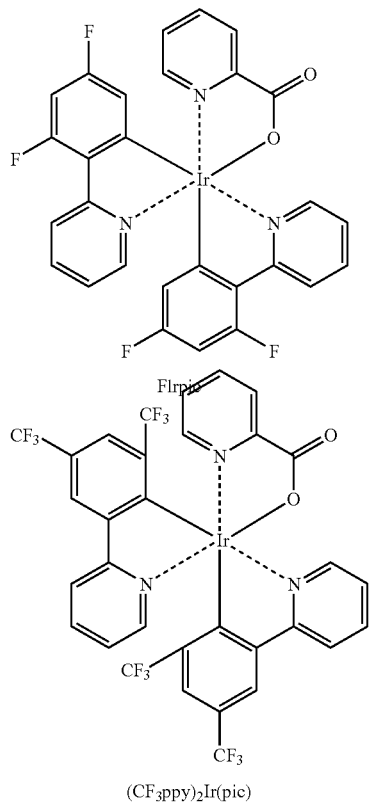

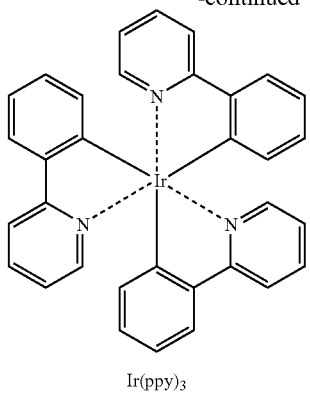

Ir(ppy)₃

In the organic electroluminescent device of the present invention, the organic material layer(s) may have a monolayer structure or a multi-layer structure having an light emitting layer. When the organic material layer(s) in the organic electroluminescent device of the present invention has multilayer structure, that may be a layered structure comprising a hole injection layer, a hole transport layer, a light emitting layer, and an electron transport layer. However, the multilayer structure of the organic material layer(s) in the organic electroluminescent device may consist of fewer layers. In such multi-layer structure, the compound of Chemical Formula 1 may be contained in a light emitting layer, a layer performing both hole injection/hole transport and light emission, a layer performing both hole transport and light emission, or a layer performing both electron transport and light emission.

For example, the organic electroluminescent device of the present invention may have the structure shown in FIGS. 1 to 4, but the structure is not limited thereto.

As seen in FIG. 1, the organic electroluminescent device of the present invention comprises a substrate 101 on which an anode 102, a light emitting layer 105 and a cathode 107 are layered sequentially. In this structure, the compound of Chemical Formula 1 may be contained in the light emitting layer 105.

FIG. 2 shows an exemplary structure of the organic electroluminescent device of the present invention, in which an anode 102, a hole injection/hole transport and light emitting layer 105, an electron transport layer 106 and a cathode 107 are layered sequentially on a substrate 101. This structure may include the compound of Chemical Formula 1 in the hole injection/hole transport and light emitting layer 105.

In the organic electroluminescent device shown in FIG. 3, a substrate 101, an anode 102, a hole transport layer 103, a hole transport and light emitting layer 105, an electron transport layer 106 and a cathode 107 are sequentially layered, on a substrate 101. In this structure, compound of Chemical Formula 1 may be included in the hole transport and light emitting layer 105.

FIG. 4 gives an exemplary structure of the organic electroluminescent device of the present invention, having a substrate 101, an anode 102, a hole injection layer 103, a hole transport layer 104, an electron transport and light emitting layer 105, and a cathode 107, which are sequentially layered. In this structure, the electron transport and light emitting layer 105 may include the compound of Chemical Formula 1 therein.

Using a vacuum deposition method or a solution coating method, the layer including the compound of Chemical Formula 1 can be formed between an anode and a cathode in the organic electroluminescent device of the present invention. Examples of the solution coating method useful in the present invention include a spin coating process, a dip coating process, a doctor blading process, an inkjet printing process, and a thermal transfer process, but are not limited thereto.

For components of the organic electroluminescent device according to the present invention, materials and preparation methods known in the art may be employed, and it should be noted that these materials and preparation methods do not limit the scope of the present invention.

A better understanding of the present invention may be obtained through the following examples which are set forth to illustrate, but are not to be construed as limiting the present invention.

EXAMPLE 1

A glass substrate coated with ITO (indium tin oxide) to a thickness of 1500 Å was washed in a solution of a detergent in distilled water by ultrasonication. The detergent was a product from Fischer Co. and the distilled water was water secondarily filtered through a filter from Millipore Co. After washing the ITO-coated glass substrate for 30 min, ultrasonication was carried out twice for 10 min per round in distilled water, and then in isopropyl alcohol, acetone, and methanol. Following the ultrasonification, the substrate was dried and transferred to a plasma chamber. Thereafter, the substrate was washed for 5 min with hydrogen/argon plasma and transferred to a vacuum depositor.

Hole injection layer was formed through thermal vacuum deposition of hexanitrile hexaazatriphenylene on the transparent ITO electrode to a thickness of 500 Å. NPB (4,4'-bis[N-(1-naphthyl)-N-phenyl-amino]biphenyl), a hole transporting material, was then vacuum deposited on the hole injection layer to a thickness of 400 Å.

On the hole transport layer, the compound of Chemical Formula 3 was vacuum deposited as a host material to a thickness of 200 Å to form a light emitting layer, with Ir(ppy)$_3$ of Chemical Formula 4 maintained at a concentration of 8% as a phosphorescent dopant.

Subsequently, BCP (2,9-dimethyl-4,7-diphenyl-1,10-phenanthroline) of Chemical Formula 5, acting as a hole blocking layer, was layered to a thickness of 60 Å through vacuum deposition on the light emitting layer, followed by the vacuum deposition of the compound of Chemical Formula 6 to a thickness of 400 Å thereon to form an electron injection/transport layer.

Afterwards, this electron injection/transport layer was coated sequentially with lithium fluoride (LiF) to a thickness of 15 Å and with aluminum to a thickness of 1500 Å to form a cathode.

In those processes, deposition rates were maintained at 0.5 Å/sec for organic materials, at 0.2 Å/sec for lithium fluoride and at 0.5~5 Å/sec for aluminum.

[Chemical Formula 3]

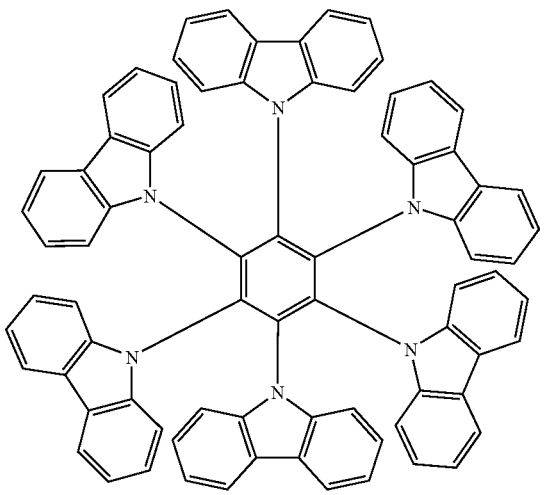

[Chemical Formula 4]

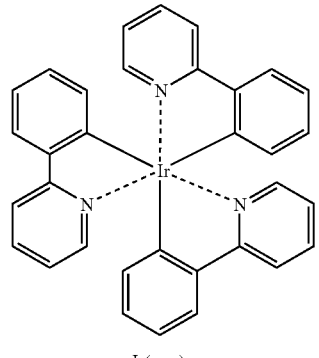

Ir(ppy)$_3$

[Chemical Formula 5]

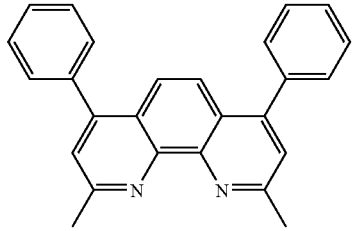

BCP

[Chemical Formula 6]

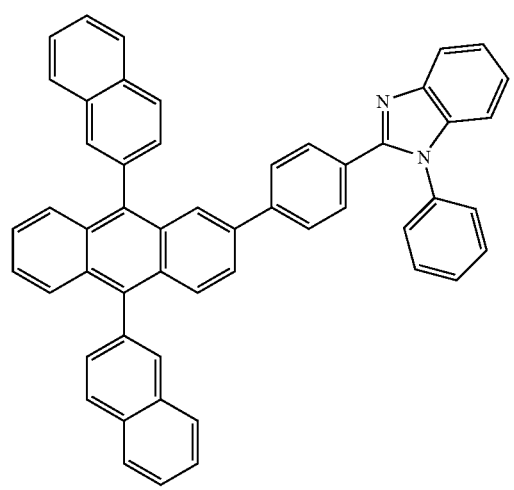

Using PR 650 and Keithley 236, the organic electroluminescent device thus made was measured for brightness and luminous efficiency at current densities of 10, 50 and 100 mA/cm$^2$, with a forward electric field of 5.2 V applied thereto. The results are given in Table 1, below. In order to measure the lifetime, the organic electroluminescent device was adjusted to have a brightness of 6000 nit with a current, the lifetime of the organic electroluminescent device was determined as the time which it took for the device to decrease in brightness from 6000 nit to half that.

COMPARATIVE EXAMPLE 1

An organic electroluminescent device was fabricated in the same manner as in Example 1 with the exception of using CBP of the following Chemical Formula 7, instead of the compound of Chemical Formula 3, as a host material for the formation of the light emitting layer. The organic electroluminescent device was measured for brightness and luminous efficiency and the results are given in Table 1, below. In addition, the lifetime was also measured in a manner identical to that of Example 1.

[Chemical Formula 7]

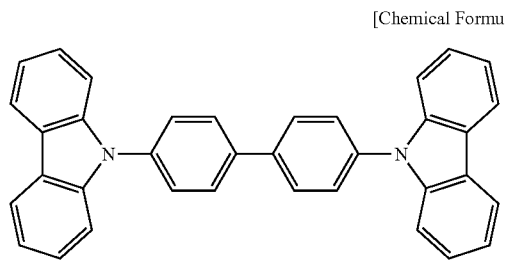

TABLE 1

| Current Density (mA/cm$^2$) | Example No. | Brightness (cd) | Luminous Efficiency (cd/A) |
|---|---|---|---|
| 10 | 1 | 3550 | 21.8 |
|  | C. 1 | 2840 | 17.0 |
| 50 | 1 | 15600 | 31.1 |
|  | C. 1 | 11800 | 23.7 |
| 100 | 1 | 29100 | 29.1 |
|  | C. 1 | 20000 | 20.0 |

Generally, phosphorescent guest materials are known to deteriorate the luminous efficiency of the organic electroluminescent device at high currents. However, as apparent from the data in Table 1, the organic electroluminescent device made in Example 1 does not decrease in luminous efficiency with an increase in applied current. Furthermore, the light emitting layer formed with the compound of the present invention in combination with the phosphorescent guest material in the organic electroluminescent device of Example 1 was found to be superior in brightness and luminous efficiency to that formed with CBP, instead of the compound of the present invention, in the organic electroluminescent device of Comparative Example 1.

As for the lifetime, it was measured to be 190 hours for the organic electroluminescent device of Example 1, relative to 100 hours for the organic electroluminescent device of Comparative Example 1. Thus, the organic electroluminescent device of Example 1 is also superior in lifetime to that of Comparative Example 1.

INDUSTRIAL APPLICABILITY

The compound of the present invention can be used as a luminescent material in an organic electroluminescent device. Particularly, with the ability to be used in combination with a phosphorescent guest material as well as a luminescent guest material, the compound can greatly improve brightness and luminous efficiency in organic electroluminescent devices.

The invention claimed is:

1. An organic electroluminescent device, comprising a first electrode, at least one organic material layer, and a second electrode, in a sequentially layered form wherein at least one layer of the organic material layer contains a compound represented by the following Chemical Formula 3:

[Chemical Formula 3]

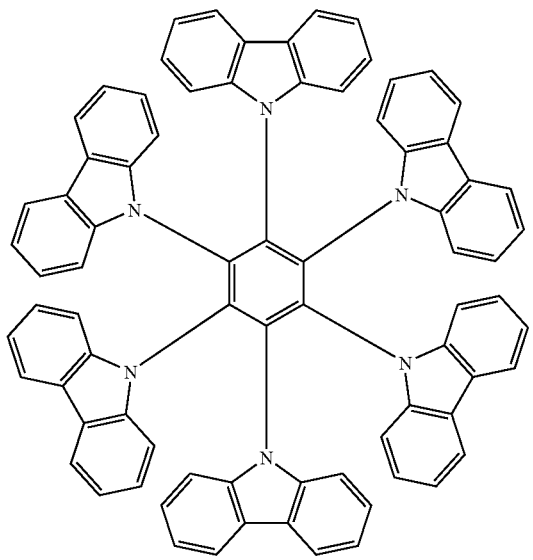

2. The organic electroluminescent device as set forth in claim 1, wherein said first electrode is an anode; said organic material layer(s) has a layered structure in which a hole injection layer, a hole transport layer, a light emitting layer and an electron transport layer are sequentially layered; and said second electrode is a cathode.

3. The organic electroluminescent device as set forth in claim 1, wherein said organic material layer(s) comprises a layer performing all of the hole injection, hole transport and light emission and contains the compound represented by Chemical Formula 3.

4. The organic electroluminescent device as set forth in claim 1, wherein said organic material layer(s) comprises a layer performing both hole transport and light emission and contains the compound represented by Chemical Formula 3.

5. The organic electroluminescent device as set forth in claim 1, wherein said organic material layer comprises a layer performing both light emission and electron transport and contains the compound represented by Chemical Formula 3.

6. The organic electroluminescent device as set forth in claim 1, wherein the layer containing the compound represented by Chemical Formula 3 further additionally contains a fluorescent guest material or a phosphorescent guest material.

* * * * *